United States Patent [19]

Chadwick

[11] 4,039,953
[45] Aug. 2, 1977

[54] AUTOMATIC AERIAL ATTENUATOR

[75] Inventor: Peter Edward Chadwick, London, England

[73] Assignee: Decca Limited, London, England.

[21] Appl. No.: 629,571

[22] Filed: Nov. 6, 1975

[30] Foreign Application Priority Data

Nov. 7, 1974 United Kingdom ............... 48171/74

[51] Int. Cl.$^2$ ............................................. H04B 1/06
[52] U.S. Cl. ................................... 325/304; 325/383; 325/387; 325/474
[58] Field of Search ............... 325/302, 304, 306, 473, 325/474, 475, 476, 472, 381, 387, 400, 413, 370, 383

[56] References Cited

U.S. PATENT DOCUMENTS

| 3,206,679 | 9/1965 | Miller | 325/304 |
| 3,622,891 | 11/1971 | Leland | 325/472 X |
| 3,769,591 | 10/1973 | Brown et al. | 325/474 |
| 3,953,802 | 4/1976 | Morris et al. | 325/474 |

Primary Examiner—Benedict V. Safourek
Attorney, Agent, or Firm—Edward F. Connors

[57] ABSTRACT

A transmission system receiver compares the received signal power in a relatively narrow frequency band with the received signal power in a relatively wide frequency band, which embraces the narrow frequency band, to obtain an indication of the "SINAD ratio" which refers to the signal plus noise plus distortion to noise plus distortion ratio. The receiver also includes an automatic control system for comparing the indication with a reference and for adjusting an attenuator in response to disparity between the indication and the reference in a sense to increase the SINAD ratio above a predetermined level, or to adjust the SINAD ratio to an optimum value.

3 Claims, 4 Drawing Figures

AUTOMATIC AERIAL ATTENUATOR

This invention relates to transmission systems having receivers with automatic control systems for optimising the received SINAD ratio.

According to the present invention there is provided a transmission system receiver including means for comparing the received signal power in a relatively narrow frequency band with the received signal power in a relatively wide frequency band embracing the narrow frequency band to obtain an indication of the SINAD ratio (as hereinafter defined) and an automatic control system for comparing the indication with a reference and for adjusting an attenuator in response to disparity between the indication and the reference in a sense to either increase the SINAD ratio above a predetermined level, or to adjust the SINAD ratio to an optimum value.

The automatic control system may be further arranged to obtain a succession of indications of the SINAD ratio and to ascertain substantial changes of the SINAD ratio denoted by the indications over the period of the succession of indications and to inhibit the said comparison in the presence of such change.

The transmission system receiver may further include means for producing a first signal representing the received signal power in the relatively narrow frequency band and a second signal represents the received signal power in the relatively wide frequency band and means for feeding said first and second signal to the means for comparing.

In which case the receiver may further include a plurality of channels, each channel having a respective means for producing the means for feeding being arranged to feed the first and second signals of each channel in cyclic succession to the means for comparing to obtain an indication for each channel and the automatic control system being arranged to compare each respective indication with the reference and to adjust the attenuator in response to the disparity between the indications and the reference in a sense to increase the SINAD ratio of all the channels above a predetermined level, or to adjust the SINAD ratio of each channel to an optimum value.

The receiver may be a radio receiver.

According to another aspect of the invention there is provided a transmission system receiver having a plurality of channels including means for each channel for comparing signal power in a relatively narrow frequency band with the signal power in a relatively wide frequency band embracing the narrow frequency band to obtain an indication of the SINAD ratio (as hereinafter defined) for the respective channel, means for comparing the indications to determine which has the greatest magnitude and means for selecting for use that channel which has the largest indication. Alternatively the means for comparing may compare the indications with an optimum value, and the means for selecting may select that channel which has the indication with a value closest to the optimum value.

The receiver may be a radio receiver. Throughout this specification the term 'SINAD ratio' refers to the signal plus noise plus distortion to noise plus distortion ratio.

The SINAD ratio for a particular channel of a radio receiver at any given time can be calculated from a comparison of the power in a slot of narrow band width located in the received signal frequency band at a point where there is little or no transmitted energy with the power over the whole of the received signal frequency band. In the audio frequency pass band, the slot of narrow band width may be located between 2700 and 3000Hz. Alternatively the slot can be obtained by filtering radio frequency transmissions at corresponding radio frequencies to those in the audio frequency pass band.

Specific embodiments of the invention will now be described with reference to the accompanying drawings, in which.

The same reference numbers are used for corresponding elements in all of the Figures.

Figure 1:
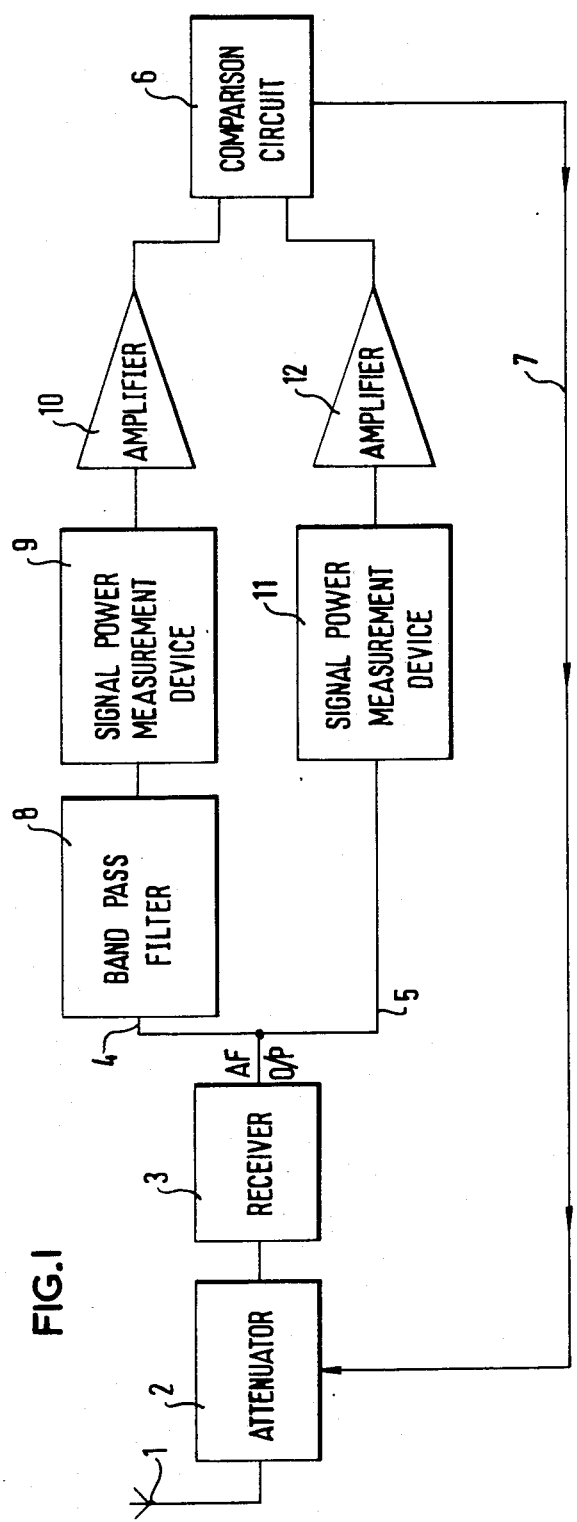
FIG. 1 is a schematic diagram of a transmission receiver system.

In FIG. 1 an aerial 1 is connected to an attenuator 2, which is in turn connected to a receiver 3. The output of the receiver 3 is connected via a first signal path 4 and a second signal path 5 to a comparison circuit 6, which is arranged to control the attenuator 2 by means of line 7. The first signal path 4 contains a band pass filter 8, a signal power measurement device 9 and an amplifier 10, whilst the second signal path 5 contains a signal power measurement device 11 and an amplifier 12.

In operation the aerial 1 receives a signal and feeds the signal via attenuator 2 to receiver 3 which produces an audio frequency output signal. The audio frequency output signal is then fed into signal paths 4 and 5, which respectively develop a first signal representing the received signal power in the frequency band passed by the filter 8 and a second signal representing the received signal power over the whole received frequency band and feed their respective signals to comparison circuit 6. The comparison circuit 6 obtains the SINAD ratio from the first and second signal, compares the resultant ratio with a reference and produces an attenuator control signal to adjust the attenuator 2 in a sense to optimize the SINAD ratio of the receiver. If the SINAD ratio is to be adjusted to an optimum value a computer operating the following programme may be used.

SUB ROUTINE 1.

Measure SINAD - Store in Store (A)
Measure SINAD - Store in Store (B)
Subtract (A) from (B)

-continued

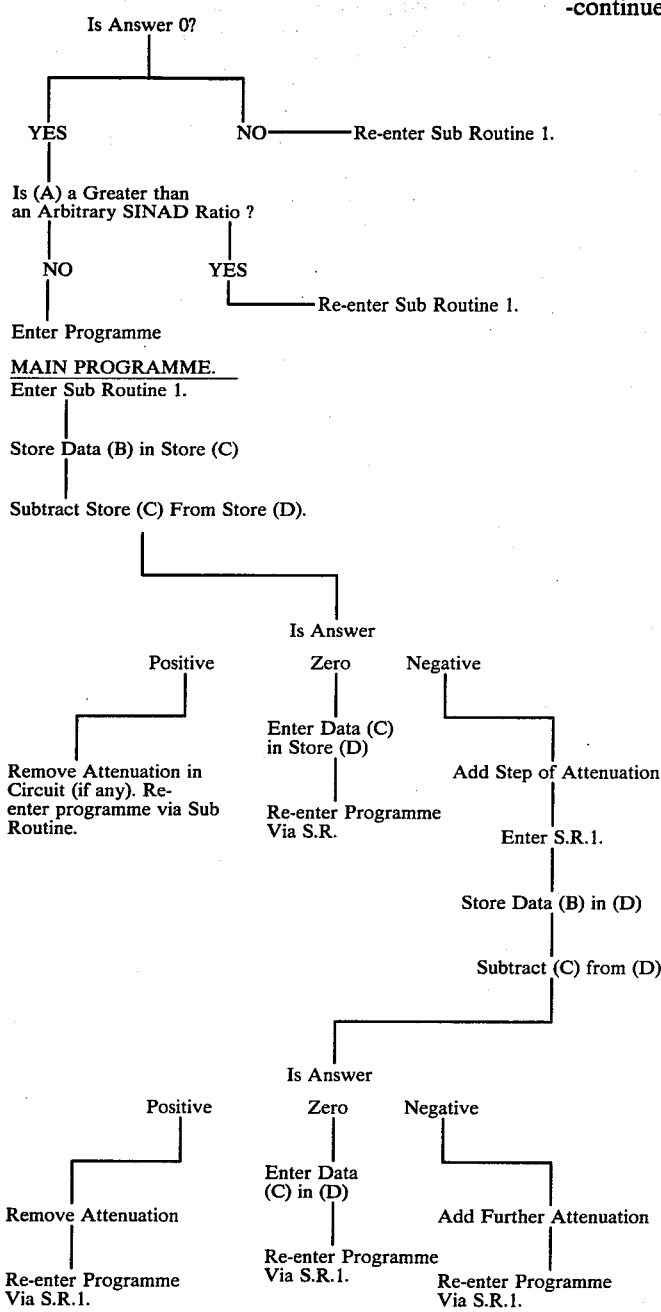

Preferably the SINAD ratio is measured twice in order to minimise incorrect adjustment of the attenuator caused by impulsive noise or similar short term disturbances. This minimising effect can be improved by increasing the number of ratio measurements made.

Figure 2:
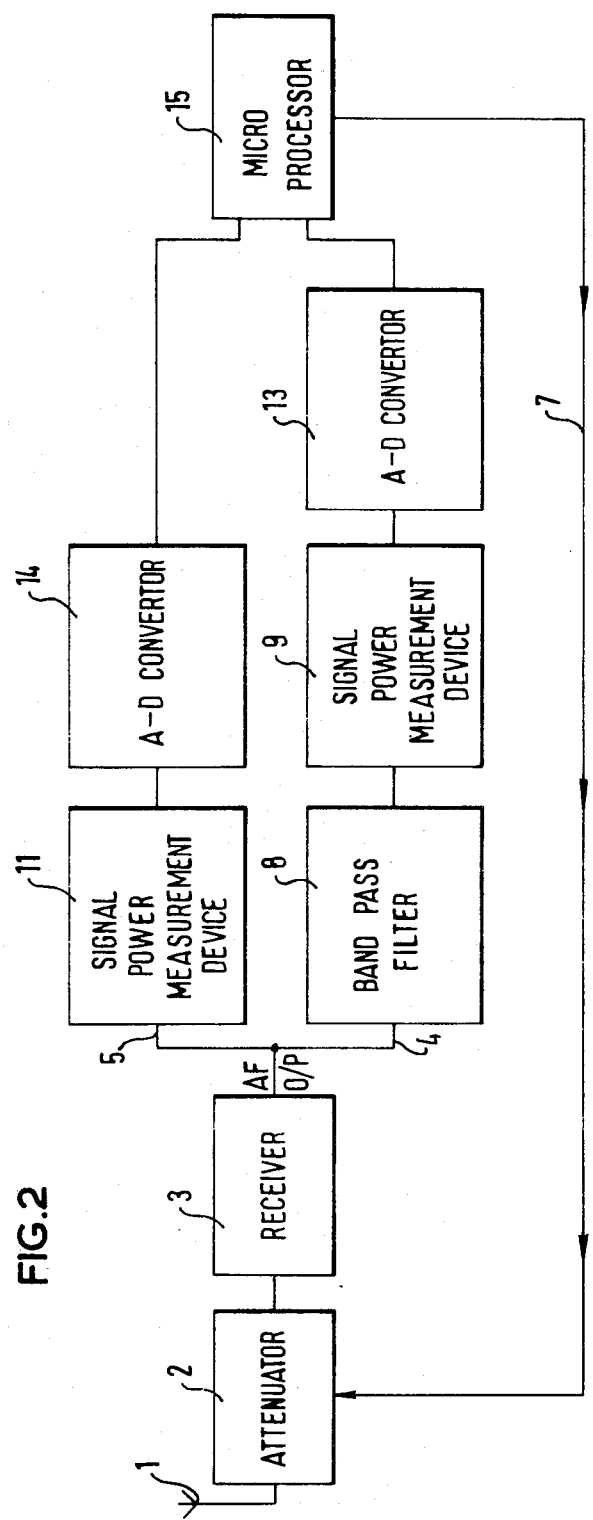
FIG. 2 is a schematic diagram of a further transmission receiver system.

The transmission system receiver of FIG. 2 is essentially the same as that of FIG. 1 except that analogue to digital convertors 13 and 14 replace amplifiers 10 and 12 respectively, and microprocessor 15 replaces comparison circuit 6. The operation of the FIG. 2 receiver is entirely analogous to the operation of the FIG. 1 circuit.

Figure 3:
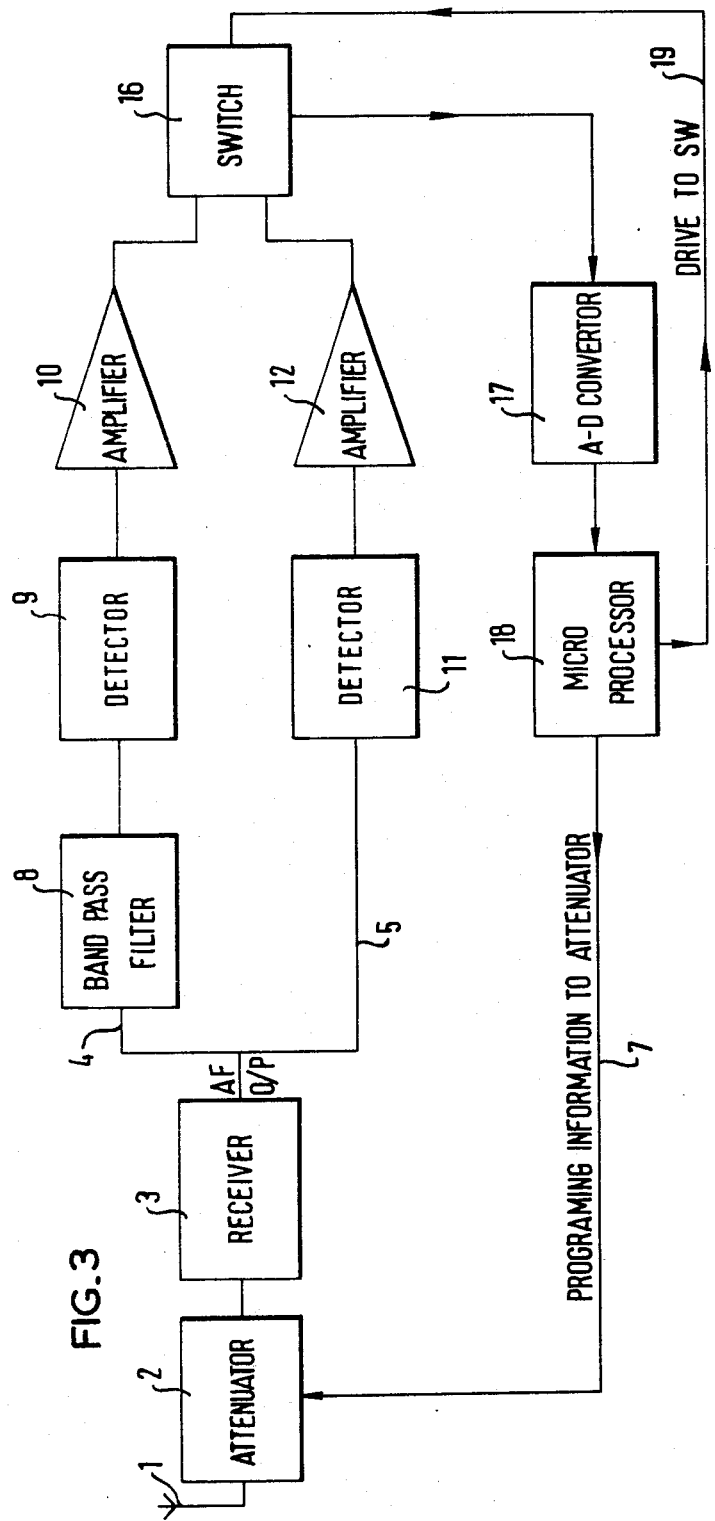
FIG. 3 is a schematic diagram of a still further transmission receiver system.

FIG. 3 shows a still further embodiment of a transmission system receiver, wherein the comparison circuit 6 of FIG. 1 has been replaced by switch 16, Analogue-to-digital converter 17 and microprocessor 18. The microprocessor 18 feeds control signals via line 19 which cause switch 16 to alternately connect signal paths 4 and 5 to the analogue-to-digital converter 17. The microprocessor 18 calculates the SINAD ratio from pairs of succesive signals received from the analogue-to-digital converter, and hence develops an attenuator control signal, which is fed to the attenuator 2 along line 7 as before.

In a diversity receiving system, apparatus may be provided to obtain the SINAD ratio for each channel, and to select the most suitable channel for use either by comparing the SINAD ratio of each channel with an optimum value and selecting the channel with a SINAD ratio closest to that value, or by comparing the SINAD ratios of all the channels and selecting that channel with the largest SINAD ratio.

Figure 4:
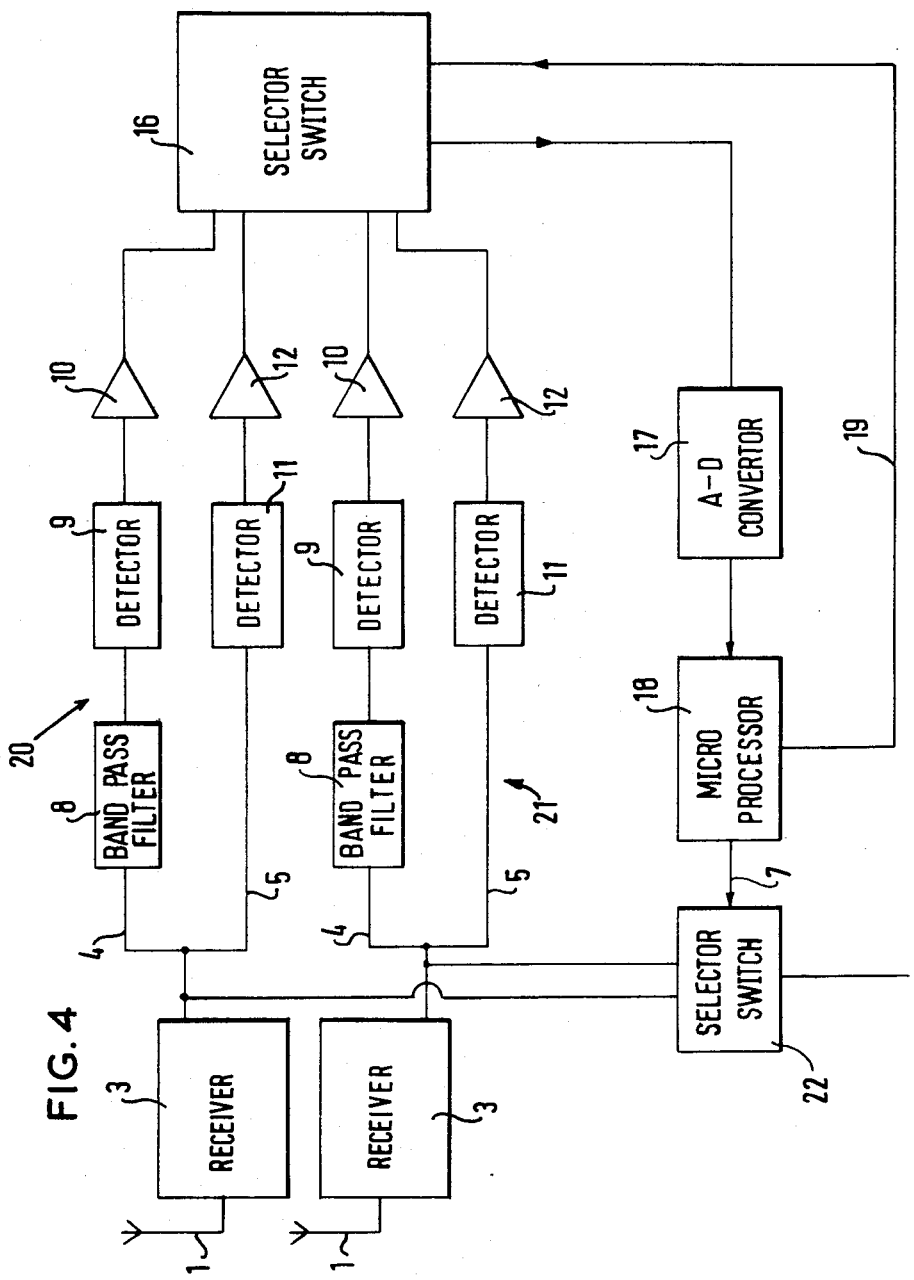
FIG. 4 is a schematic diagram of a multi-channelled transmission receiver system.

FIG. 4 is a schematic diagram of a diversity receiving system having a similar control circuit to FIG. 3 except that the SINAD ratio calculated by the microprocessor for each channels 20 and 21 are compared with a reference and that channel which has the highest SINAD ratio or alternatively is closest to an optimum value is selected by switch 22, the operation of which is controlled by microprocessor 18.

I claim:

1. A transmission system receiver including:
    an aerial;
    an attenuator having an input and an output, the input being connected to the aerial;
    a receiver having an input and an output, the receiver input being connected to the output of the attenuator;
    a micro-processor having at least one input and having an output connected to the attenuator;
    a first signal path extending between the output of the receiver and an input of the micro-processor and including means for measuring the signal power of the input signals of the receiver and means for obtaining a first digital indication of the measured signal power and for feeding the digital indication to the micro-processor; and,
    a second signal path extending between the output of the receiver and an input of the micro-processor and including a base band filter for filtering the output of the receiver, means for measuring the signal power of the filtered signal and means for obtaining a second digital indication of the measured filtered signal power; the micro-processor being arranged to obtain an indication of the SINAD ratio (as hereinbefore defined) from the first and second digital indications and to compare the indications of the SINAD ratio with a reference to obtain a control signal for controlling the attenuation of the attenuator.

2. A transmission system receiver as claimed in claim 1 wherein the means for obtaining a digital indication which is disposed in the first signal path and the means for obtaining a digital indication which is disposed in the second signal path are both constituted by a single analogue to digital converter and wherein the receiver further includes a cyclically operable switch, which is disposed in the first and second signal paths between the analogue to digital converter and respective means for measuring signal power, for cyclically connecting the means for measuring signal power to the analogue to digital converter in response to a control signal from the micro-processor.

3. A diversity receiving system comprising: a plurality of channels, each channel comprising an aerial, a receiver having an input connected to the aerial and an output, the first signal path connected to the output of the receiver and including means for measuring the signal power of the output signal of the receiver, the second signal path connected to the output of the receiver and including a base band filter for filtering the output of the receiver, means for measuring the signal power of the filtered signal and means for obtaining a second digital indication of the measured filtered signal; a cyclically operable switch having an input for each signal path of each channel and an output; means for obtaining a digital indication of the output of the cyclically operable switch; a micro-processor for obtaining an indication of the SINAD ratio (as hereinbefore described) from the digital indication of signals received from respective pairs of the first and second signal paths and for comparing the indications of the SINAD ratio with a reference to obtain a control signal; and,
    a selector switch having an input connected to the output of the respective receiver of each channel and an output, the selector switch being operable in response to the control signal produced by the micro-processor.

* * * * *